United States Patent
Kao et al.

[11] Patent Number: 6,063,673
[45] Date of Patent: *May 16, 2000

[54] TRANSISTOR DEVICE STRUCTURES, AND METHODS FOR FORMING SUCH STRUCTURES

[75] Inventors: David Y. Kao; Jeff Zhiqiang Wu, both of Meridian, Id.

[73] Assignee: Micron Technology, Inc., Boise, Id.

[*] Notice: This patent is subject to a terminal disclaimer.

[21] Appl. No.: 09/144,512

[22] Filed: Aug. 31, 1998

Related U.S. Application Data

[63] Continuation of application No. 08/694,601, Aug. 9, 1996, Pat. No. 5,811,338.

[51] Int. Cl.$^7$ ................................ H01L 21/336

[52] U.S. Cl. ..................... 438/286; 438/305; 438/529

[58] Field of Search .................... 438/286, 305, 438/303, 529

[56] References Cited

U.S. PATENT DOCUMENTS

| | | | |
|---|---|---|---|
| 4,837,179 | 6/1989 | Foster et al. | 438/306 |
| 4,943,537 | 7/1990 | Harrington, III . | |
| 5,122,474 | 6/1992 | Harrington, III . | |
| 5,170,232 | 12/1992 | Narita | 257/336 |
| 5,364,807 | 11/1994 | Hwang | 438/286 |
| 5,389,557 | 2/1995 | Jung-Suk | 438/305 |
| 5,416,351 | 5/1995 | Ito et al. . | |
| 5,464,785 | 11/1995 | Hong | 438/306 |
| 5,504,024 | 4/1996 | Hsu | 438/305 |
| 5,565,700 | 10/1996 | Chou et al. | 257/408 |
| 5,595,919 | 1/1997 | Pan | 438/305 |
| 5,606,191 | 2/1997 | Wang | 257/336 |
| 5,614,752 | 3/1997 | Takenaka | 257/408 |
| 5,635,743 | 6/1997 | Takahashi | 257/343 |
| 5,654,574 | 8/1997 | Williams et al. | 257/355 |
| 5,731,611 | 3/1998 | Hshieh et al. | 257/341 |
| 5,780,895 | 7/1998 | Barret et al. | 257/328 |
| 5,891,774 | 4/1999 | Ueda et al. | 438/264 |
| 5,923,987 | 7/1999 | Burr | 438/304 |

FOREIGN PATENT DOCUMENTS

| | | | |
|---|---|---|---|
| 5-267331A | 10/1993 | Japan | 438/FOR 204 |
| 5-347316A | 12/1993 | Japan | 438/FOR 204 |

OTHER PUBLICATIONS

Buti, et al., "A New Asymmetrical source Gold Drain (HS–GOLD) Deep Sub–Half–Micrometer n–MOSFET Design for Reliability and Performance," IEEE Transaction on Electron Devices, vol. 38, No. 8, pp. 1757–1764.

5–347408

*Primary Examiner*—Richard Booth
*Attorney, Agent, or Firm*—Wells, St. John, Roberts, Gregory & Matkin, P.S.

[57] ABSTRACT

In one aspect, a method for forming a transistor device on a semiconductor substrate, comprising: a) forming a transistor gate on the substrate; b) forming a first polarity source active region and a first polarity drain active region operatively adjacent the transistor gate; and c) forming a second polarity internal junction region, the second polarity internal junction region being entirely received within one of the first polarity regions. In another aspect, a transistor device, comprising: a) a transistor gate on a semiconductor substrate; b) a first polarity source active region and a first polarity drain active region operatively adjacent the transistor gate; and c) a second polarity internal junction region entirely received within one of the first polarity regions. In yet another aspect, the invention includes a resistor, comprising: a) a gate on a semiconductor substrate, the gate being electrically powered with a gate voltage; b) a first polarity source active region and a first polarity drain active region operatively adjacent the electrically powered gate; c) a second polarity internal junction region entirely received within one of the first polarity regions; and d) a current between the first polarity source active region and the first polarity drain active region, the current being substantially linearly dependent on a voltage at the drain region.

12 Claims, 7 Drawing Sheets

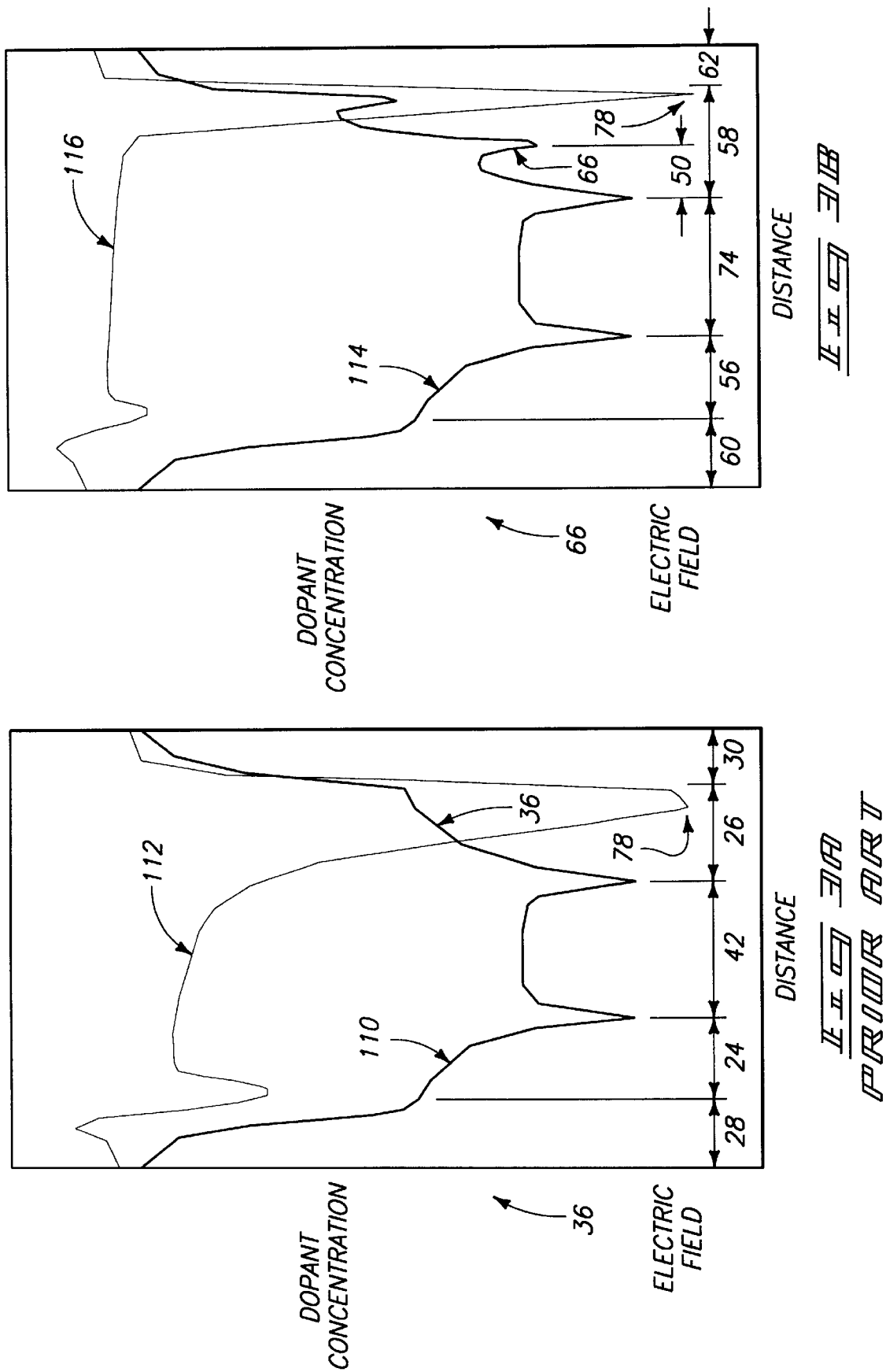

TRANSISTOR DEVICE STRUCTURES, AND METHODS FOR FORMING SUCH STRUCTURES

This application resulted from a continuation application of U.S. patent application Ser. No. 08/694,601 filed Aug. 9, 1996, now U.S. Pat. No. 5,811,338.

TECHNICAL FIELD

This invention pertains to semiconductor transistor structures and semiconductor resistor structures, and to methods of forming such structures.

BACKGROUND OF THE INVENTION

A typical prior art semiconductor transistor device is described with reference to FIG. 1, wherein a semiconductor wafer fragment 10 is shown. Wafer fragment 10 comprises a semiconductor material substrate 11, preferably silicon, and a transistor device 12 on the substrate 11.

Device 12 comprises a transistor gate 14, a channel region 42 beneath the transistor gate, and source and drain active regions 20 and 22, respectively, opposingly adjacent the channel region and operatively adjacent the transistor gate. By "operatively adjacent", it is meant that the source and drain active regions 20 and 22 function together with the transistor gate 14 to form an operating transistor device 12.

The source and drain active regions comprise relatively low conductivity regions 24 and 26, and relatively high conductivity regions 28 and 30. The relatively low conductivity regions 24 and 26 are source and drain Lightly Doped Diffusion (LDD) regions, respectively, and the relatively high conductivity regions are source and drain regions 28 and 30, respectively. The relative conductivity of regions 24, 26, 28 and 30 is determined by the amount of conductivity-enhancing dopant within the regions: The relatively low-conductivity LDD regions, 24 and 26, being less heavily doped than the relatively high-conductivity source and drain regions 28 and 30.

The source and drain active regions 20 and 22 have a polarity, and this polarity is determined by the type of transistor device 12 formed. If transistor device 12 is a P-channel Metal-Oxide Semiconductor field effect transistor (PMOS), then source and drain active regions 20 and 22 will comprise p-type conductivity enhancing dopant, and will accordingly have a p-type polarity. If, on the other hand, transistor device 12 is an N-channel Metal-Oxide Semiconductor field effect transistor (NMOS) device, source and drain active regions 20 and 22 will comprise n-type conductivity enhancing dopant and will accordingly have an n-type polarity.

Referring to the gate 14, gate 14 comprises an insulative oxide layer 32, and laterally opposing edges 34 and 36. Gate 14 will typically comprise several layers of material, including a polysilicon layer over the oxide layer 32, a metal silicide layer over the polysilicon layer and an insulative capping layer over the metal silicide layer. Adjacent edges 34 and 36 of gate 14 are insulative sidewalls 38 and 40.

In operation, source region 28 is biased relative to drain region 30, a voltage is applied to gate 14, and electrons flow between the source and drain regions 28 and 30 through channel region 42. Several problems can occur as the source and drain regions 28 and 30 are biased relative to one another. These problems include Drain-Induced Barrier Lowering (DIBL) and Hot Electron effects.

DIBL is normally observed when the source and drain are biased relative to one another, and when the gate voltage is well below a threshold voltage of the gate—the threshold voltage being the minimum voltage necessary to open channel 42 for relatively unimpeded electron flow between the source 28 and the drain 30.

Before explaining DIBL further, device 12 will be described in greater detail. Device 12 typically comprises two back-to-back diodes between source 28 and drain 30. For instance, if device 12 is an NMOS transistor device, source 28 and drain 30 are n-type regions and channel 42, between them, is a p-type region. Thus, device 12 comprises a first diode, containing source 28 and channel 42, and a second diode, containing channel 42 and drain 30, in back-to-back orientation relative to one-another. Each diode will comprise a junction at the interface of the n-type and p-type regions, and each junction will have a potential energy barrier associated with it. Carriers of NMOS device 12 (the carriers being electrons) will need to overcome the potential barriers to travel from source 28 to drain 30. At low gate voltages, device 12 is off and a leakage current between source 28 and drain 30 is limited by the potential energy barriers of the junctions. When the gate voltage is increased, the potential energy barriers are lowered, enabling relatively unimpeded current flow from source 28 to drain 30, i.e., device 12 is turned on.

If channel 42 comprises a short length, the potential energy barrier of a junction can be reduced by a voltage at the drain, even when the voltage at the gate is low. Such drain-voltage induced reduction of a potential energy barrier is DIBL. Once a potential energy barrier is lowered, some of the carriers in the source can leak from source to body, creating an undesired source-to-body current flow, or leak from source to drain, creating an undesired subthreshold current. Accordingly, it is desired to decrease DIBL.

Hot electron effects occur when a surface potential beneath gate oxide 32 is lowered, permitting a subthreshold current flow in the channel region 42 at an oxide-substrate interface between gate oxide 32 and semiconductor substrate 11. A particularly undesired consequence of hot electron effects is that hot carriers at the oxide-substrate interface are occasionally ejected into gate oxide 32, damaging the gate oxide 32 and possibly becoming trapped in the gate oxide. Damage to the gate oxide due to hot carrier ejection accumulates over time, and will likely eventually shift a threshold voltage of device 12, and ruin the device 12. Accordingly, it is desired to decrease hot electron effects.

The above-discussed problems, DIBL and hot electron effects, are commonly referred to as short-channel effects because they tend to be most problematic in transistor devices having channels less than 2 microns long. As such short-channel transistors are becoming increasingly common through device miniaturization, it is desired to develop structures and methods which alleviate hot carrier effects in short-channel devices.

Other undesired aspects of presently-available short-channel devices pertain to the relatively limited domain over which there is a linear dependance of source-drain current on source-drain voltage. This problem is illustrated in Panel A of FIG. 4, which shows drain-source current ($I_{DS}$) plotted against drain-source voltage ($V_{DS}$), at varying gate-source voltages ($V_{GS}$) of 0 volt, 1 volt, 2 volts, 3 volts, and 4 volts; for a transistor device with a gate length of about 0.6 microns. As shown, at $V_{GS}$ greater than zero, there tends to be a relatively short region wherein $I_{DS}$ is linearly dependant on $V_{DS}$, after which $I_{DS}$ plateaus and remains relatively constant for increasing $V_{DS}$. It would be desirable to create a longer domain of linear dependence of $I_{DS}$ on $V_{DS}$ for short-channel semiconductor devices.

SUMMARY OF THE INVENTION

This invention pertains to semiconductor devices having second polarity internal junction regions entirely contained within first polarity regions. The invention also pertains to methods for making such devices.

BRIEF DESCRIPTION OF THE DRAWINGS

Preferred embodiments of the invention are described below with reference to the following accompanying drawings.

FIG. 3 is a graphic comparison of a prior art transistor device (Panel A) with a device of the present invention (Panel B), illustrating electric field versus location.

DESCRIPTION OF SPECIFIC EMBODIMENTS

This disclosure of the invention is submitted in furtherance of the constitutional purposes of the U.S. Patent Laws "to promote the progress of science and useful arts" (Article 1, Section 8).

The invention disclosed herein pertains generally to devices having one or more second polarity internal junction regions entirely received within first polarity regions. The invention disclosed herein also relates to methods of forming such devices. The invention is described with reference to FIGS. 2, 3B, 4B, and 5–11.

Figure 2:
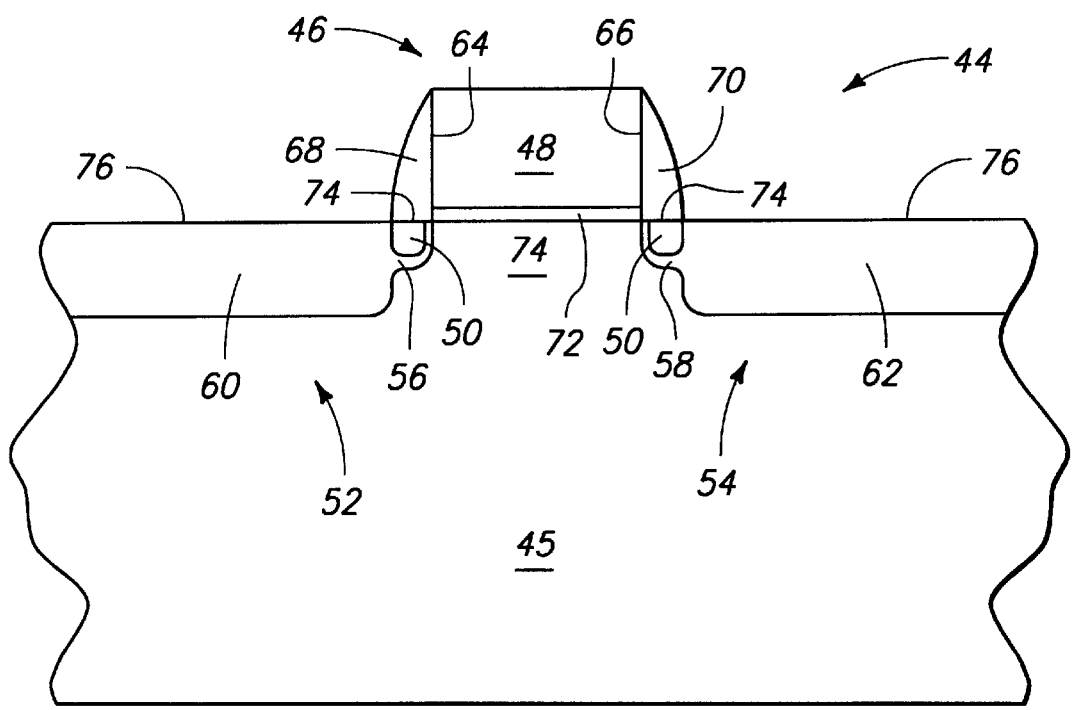
FIG. 2 is a fragmentary sectional view of a transistor device produced in accordance with a method of the present invention.

Referring to FIG. 2, a wafer fragment 44 comprises a transistor device 46 atop a semiconductor material substrate 45. Semiconductor material 45 preferably comprises silicon. Device 46 comprises a gate 48, and source and drain active regions 52 and 54, respectively.

Gate 48 comprises laterally opposing edges 64 and 66, and preferably has the same preferable construction described previously with respect to prior art. Adjacent edges 64 and 66 are sidewall spacers 68 and 70, respectively. Sidewall spacers 68 and 70 preferably comprise insulative material such as, for example, silicon nitride or silicon oxide. Beneath gate 48 is an oxide layer 72 and a channel region 74.

Source and drain active regions 52 and 54 comprise regions having relatively high conductivity, 60 and 62, and regions having relatively low conductivity, 56 and 58. Regions 56 and 58 are preferably source and drain LDD regions, respectively, and regions 60 and 62 are source and drain regions, respectively.

As discussed above regarding the prior art, the polarity of source and drain active regions 52 and 54 will be determined by the type of transistor device 46. If transistor device 46 is a PMOS, source and drain active regions 52 and 54 will comprise p-type conductivity enhancing dopant, and will accordingly have a p-type polarity. If, on the other hand, transistor device 46 is an NMOS device, source and drain active regions 52 and 54 will comprise n-type conductivity enhancing dopant and will accordingly have an n-type polarity.

Within the source and drain active regions 52 and 54 are internal junction regions 50, the internal junction regions having an opposite type polarity to the source and drain active regions 52 and 54. Accordingly, if device 46 is a PMOS, internal junction regions 50 will comprise n-type polarity, and if device 46 is an NMOS, internal junction regions 50 will comprise p-type polarity. The internal junction regions 50 are entirely received within the source and drain active regions 52 and 54, and preferably comprise an upper surface 74 which is coextensive with a portion of an upper surface 76 of the semiconductor substrate 45.

Figure 1:
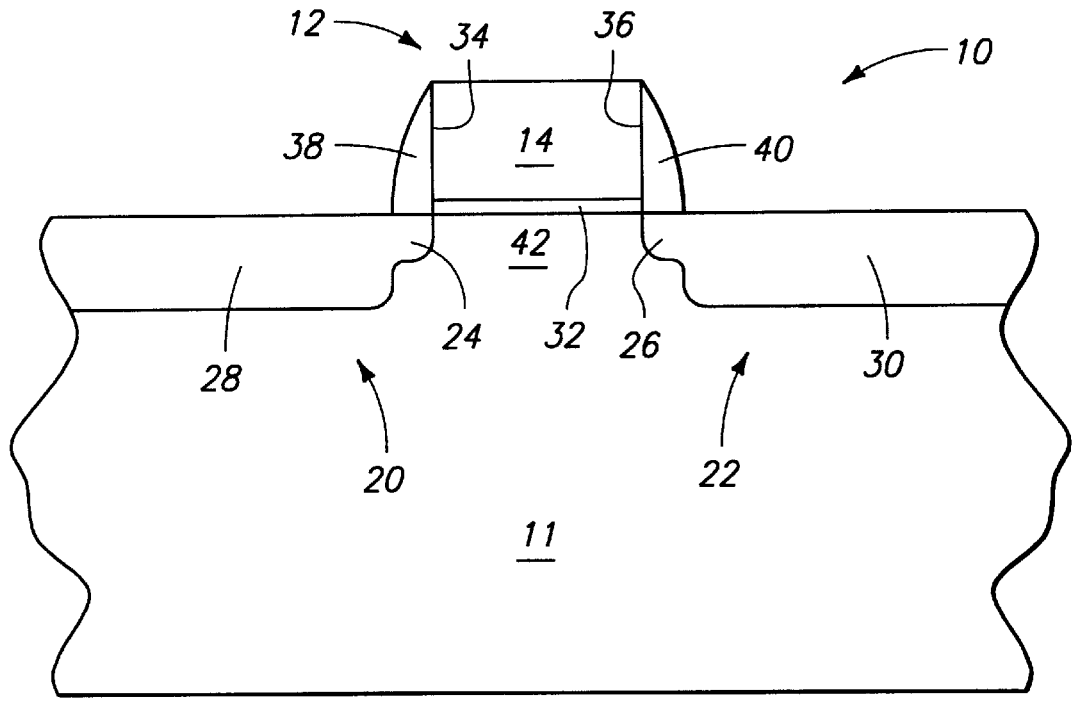
FIG. 1 is a fragmentary sectional view of a transistor device in accordance with the prior art.

The internal junction regions 50 can alleviate undesired short channel effects, such as hot carrier ejection, of the device 46, relative to the conventional transistor device 12 (shown in FIG. 1), by providing additional p-n junctions within the device 46. Internal junction regions 50 are generally most effective for impeding hot carrier ejection if they are placed as near channel region 74 as possible while still being entirely retained within an opposite polarity region. Thus, in the shown preferable embodiment, internal junction regions 50 are located beneath sidewall spacers 70.

Although the internal junction regions 50 are shown in both the source active region 52 and drain active region 54, the internal junction regions in the drain active region 54 are generally more effective for alleviating DIBL than are the internal junction regions in the source active region 52. Thus, it is most preferable that an internal junction region 50 be within the drain active region 54. Also, by having an upper surface 74 of internal junction regions 50 coextensive with an upper surface 76 of semiconductor substrate 45, the internal junction regions 50 are in a preferred location for reducing DIBL. An internal junction region 50 within the drain LDD 58 functions to displace a maximal electric field from substantially beneath gate edge 66 toward the drain 62, as illustrated in FIG. 3.

Referring to FIG. 3, a graphic comparison of a prior art NMOS transistor device (Panel A) with an NMOS device of the present invention (Panel B). Superimposed in panels "A" and "B" are graphs of dopant concentration versus distance (110 and 114), and electric field versus distance (112 and 116). The source region 28, source LDD region 24, channel region 42, gate edge 36, drain LDD region 26 and drain region 30 of the prior art transistor device are labeled in Panel A, as are the source region 60, source LDD region 56, channel region 74, drain LDD region 58, drain region 62, internal junction region 50, and gate edge 66 of the device of the present invention in Panel B.

The devices compared in panels A and B have virtually the same feature sizes (with gate lengths of about 0.6 microns), except that the transistor of the present invention (Panel B) contains an internal junction region 50 within the drain LDD region 58. As shown, the result of the internal junction region is to shift an electric field spike 78 away from a gate edge and toward the drain region 62. By shifting the electric field away from the gate edge, the present invention alleviates undesired short-channel effects.

Figure 4A:
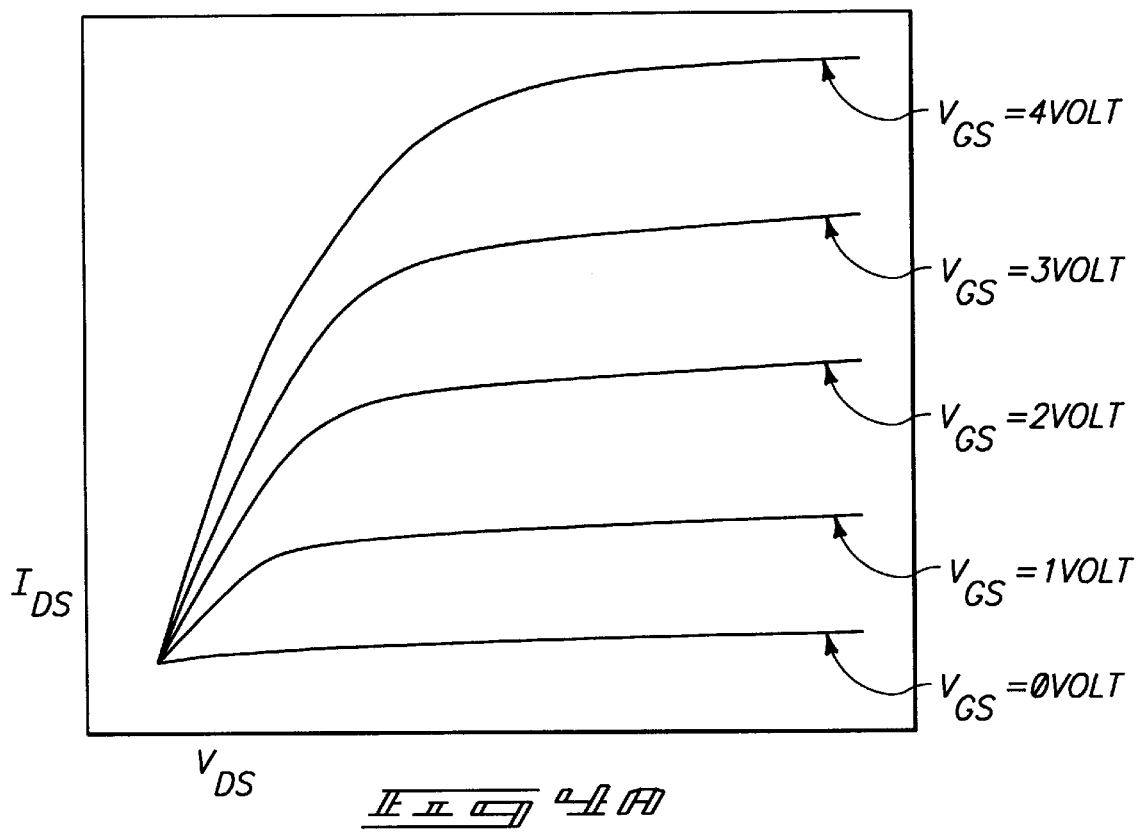
FIG. 4 is a graphic comparison of a prior art transistor device (Panel A) with a device of the present invention (Panel B), illustrating $I_{DS}$ versus $V_{DS}$ with varying $V_{GS}$.
Figure 4B:
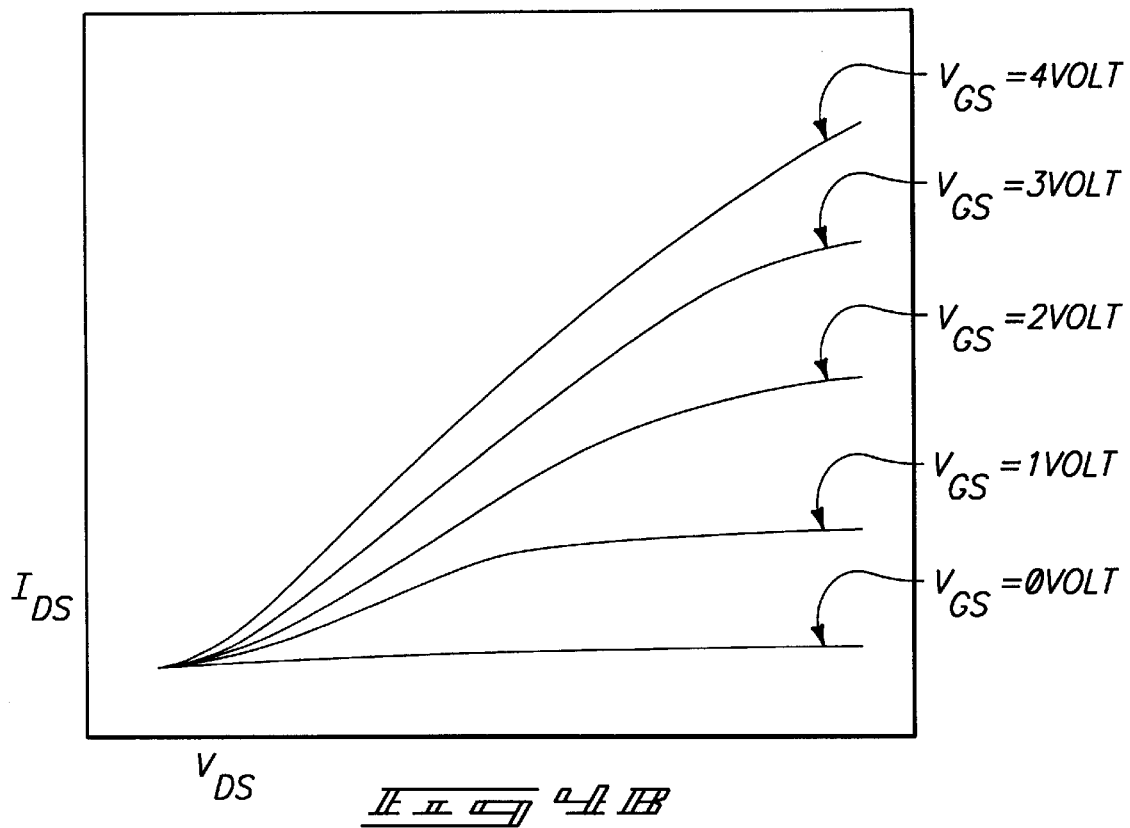

Another advantage of the present invention, relative to the prior art, is illustrated in FIG. 4. Referring to FIG. 4, Panel A, the $I_{DS}$ of a prior art transistor is plotted against the $V_{DS}$ of the transistor, at varying $V_{GS}$. In FIG. 4, Panel B, the same parameters are plotted for a transistor device of the present invention. Both transistor devices were essentially identical (having gate lengths of about 0.6 microns), except that the transistor device of the present invention contained an internal junction region within the drain LDD region. As shown, the internal junction region of the present invention has improved the linearity of $I_{DS}$ versus $V_{DS}$, in other words has extended the Ohm's law domain of the transistor device.

The increased linearity of the $I_{DS}$ versus $V_{DS}$ relationship improves the utility of a transistor device of the present invention (such as device 46 in FIG. 2), relative to a conventional short-channel transistor (such as device 12 in FIG. 1), as a resistor in integrated circuitry. To use the transistor device 46 as a resistor, a gate voltage is applied to gate 48 to thereby open channel region 74 and permit current to cross from the drain to the source, or vice versa. Once gate 48 is electrically powered and channel 74 thereby opened, device 46 functions as a resistor.

As the above discussion indicates, the device of the present invention, i.e. a transistor device comprising at least one second polarity internal junction region 50 entirely received within at least one of the first polarity active regions 52 and 54, may provide numerous advantages relative to a conventional transistor device lacking such an internal junction region. Among these, the device of the present invention may comprise a reduced hot carrier ejection into a gate oxide layer, may extend the Ohm's law relationship to a higher breakdown drain voltage, may reduce DIBL and, by the reduction of hot carrier effects, may increase device lifetime. In other words, the present invention may enable transistor devices having channel lengths of less than 2 microns to attain functional characteristics typical of longer-channel devices. The invention may have particular utility in devices with ultra-short channel lengths, i.e., channel lengths on the order of one micron or less.

Methods for forming transistor devices of the present invention are next described with reference to FIG. 5–11. A first embodiment process is described with reference to FIGS. 5–8, and a second embodiment process is described with reference to FIGS. 9–11.

Figure 5:
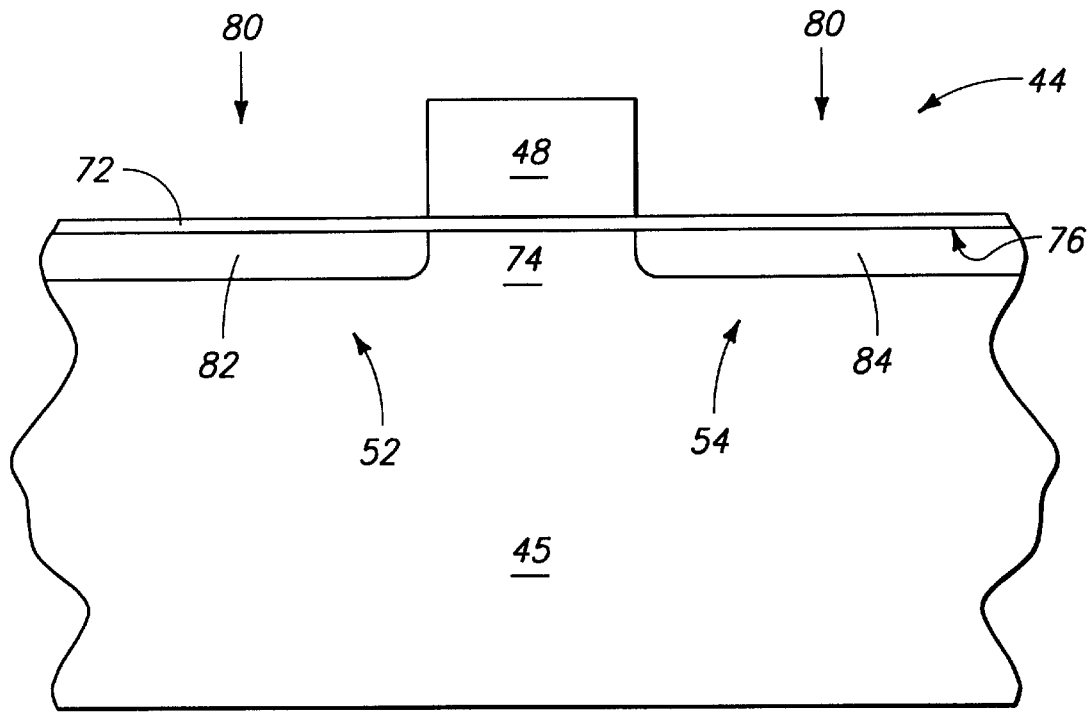
FIG. 5 shows a semiconductor wafer fragment processed according to a first embodiment of the present invention.

Referring first to FIG. 5, a semiconductor wafer fragment 44 is illustrated at a preliminary step of the first embodiment process. An oxide layer 72 extends across an upper surface 76 of semiconductor substrate 45. A gate 48 is patterned above the oxide layer 72. Gate 48 preferably comprises the preferable layers described previously with the respect to the prior art. Gate 48 defines source and drain active regions 52 and 54, respectively, operatively adjacent the gate, and channel region 74 between the active regions 52 and 54.

After formation of gate 48, a first polarity dopant 80 is implanted into source and drain active regions 52 and 54 to form relatively low conductivity implant regions 82 and 84. Low conductivity implant regions 82 and 84 will ultimately form LDD regions 56 and 58 (shown in FIG. 8) Preferably, if an NMOS transistor device is formed, the dopant 80 will comprise arsenic, and will preferably be implanted at a dose of from about $1\times10^{17}$ atoms/cm$^2$ to about $1\times10^{19}$ atoms/cm$^2$ and at an energy of from about 10 KeV to about 50 KeV. If a PMOS transistor device is formed, dopant 80 will preferably comprise boron, which will preferably be implanted at a dose of from about $1\times10^{17}$ atoms/cm$^2$ to about $1\times10^{19}$ atoms/cm$^2$ and at an energy of from about 10 KeV to about 50 KeV.

Figure 6:
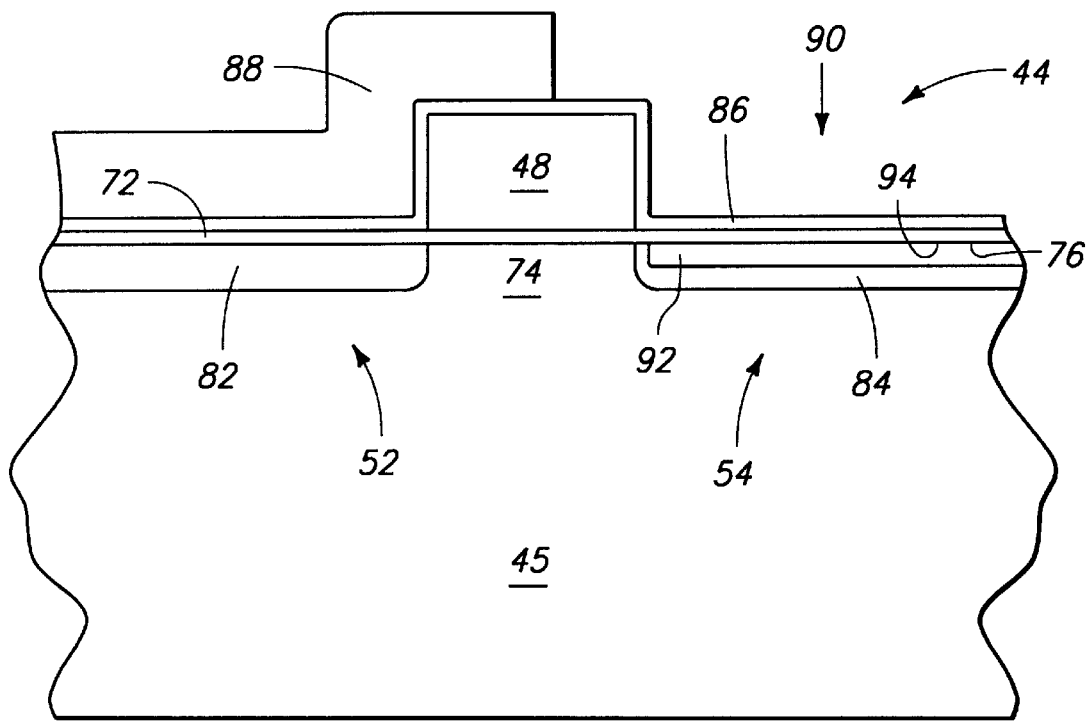
FIG. 6 shows the FIG. 5 wafer fragment at a processing step subsequent to FIG. 5.

Referring next to FIG. 6, the wafer fragment 44 is shown at a processing step subsequent to the step of FIG. 5. An insulative layer 86 is formed over gate 48 and over oxide layer 72. Insulative layer 86 functions as a spacer during a subsequent deposition of an internal junction region implant 92. Layer 86 preferably comprises an oxide, and preferably has a thickness of from about 300 Angstroms to about 800 Angstroms. The oxide of layer 86 may be deposited or grown.

After provision of the insulative layer 86, a dopant 90, comprising a second polarity relative to the polarity of dopant 80, is implanted to form the internal junction region implant 92. Preferably, as shown, internal junction region implant 92 is entirely received within the low conductivity implant 84, and comprises an upper surface 94 which is coextensive with a portion of the upper surface 76 of semiconductor substrate 45. Also, preferably the internal junction region implant 92 extends to a depth within material 45 which is approximately one-quarter to one-half of a depth to which the low conductivity implant 84 extends within material 45. Thus, if the low conductivity implant 84 extends to a depth of about 0.2 microns, the internal junction region implant 92 will preferably extend to a depth of from 0.05 to 0.1 microns.

As mentioned, dopant 90 comprises a second polarity relative to the polarity of the LDD implant 80. Thus, if an NMOS transistor device is formed, dopant 90 will preferably comprise boron and will preferably be implanted at an energy of from about $1\times10^{17}$ atoms/cm$^2$ to about $1\times10^{19}$ atoms/cm$^2$ and at an energy of from about 10 KeV to about 50 KeV. If a PMOS transistor device is formed, dopant 90 will preferably comprise arsenic and will preferably be implanted at a dose of from about $1\times10^{17}$ atoms/cm$^2$ to about $1\times10^{19}$ atoms/cm$^2$ and at an energy of from about 10 KeV to about 50 KeV.

In the shown preferred embodiment, a masking layer 88 is provided over source active region 52 prior to the implant of dopant 90. Masking layer 88 prevents the dopant 90 from reaching the source active region 52, thus preventing formation an internal junction region 50 (shown in FIG. 8) within the source active region.

Figure 7:
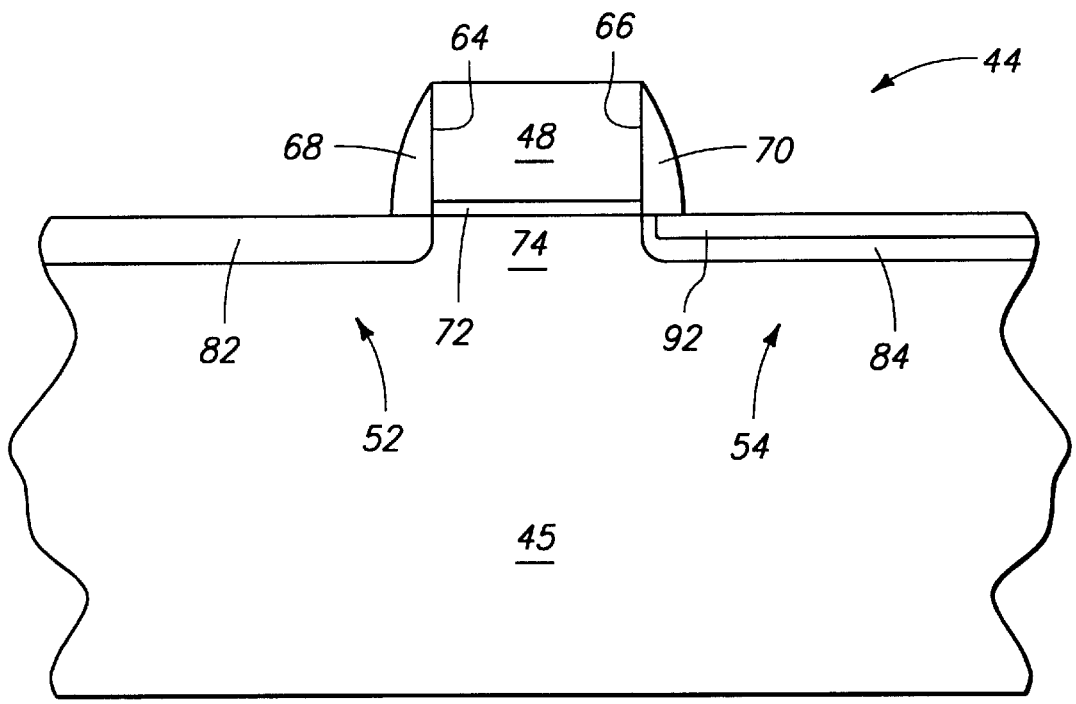
FIG. 7 shows the FIG. 5 wafer fragment at a processing step subsequent to FIG. 6.

Referring next to FIG. 7, the masking layer 88 and insulating layer 86 are removed, and sidewall spacers 68 and 70 are formed adjacent the gate lateral edges 64 and 66, respectively. Sidewall spacers 68 and 70 are typically formed from an insulative material such as, for example, a silicon oxide or silicon nitride.

Figure 8:
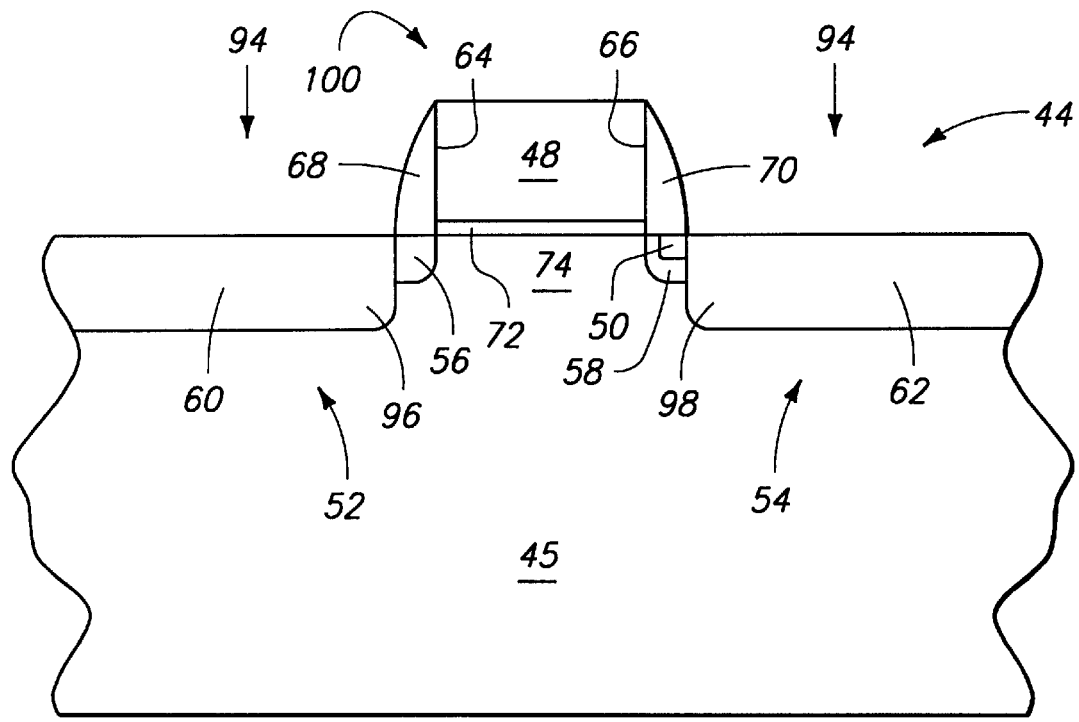
FIG. 8 shows the FIG. 5 wafer fragment at a processing step subsequent to FIG. 7.

Referring next to FIG. 8, a first polarity conductivity enhancing dopant 94 is implanted into the source and drain active regions 52 and 54 to form a source implant region 96 and a drain implant region 98. The dopant 94 is preferably relatively heavily implanted compared to the dopants 80 and 90. For example, if an NMOS transistor device is formed, dopant 94 will preferably comprise arsenic and will preferably be implanted at a dose of from about $0.5\times10^{19}$ atoms/cm$^2$ to about $1\times10^{21}$ atoms/cm$^2$ and at an energy of from about 10 KeV to about 50 KeV. If a PMOS transistor device is formed, dopant 94 will preferably comprise boron and will preferably be implanted at a dose of from about $0.5\times10^{19}$ atoms/cm$^2$ to about $1\times10^{21}$ atoms/cm$^2$ and at an energy of from about 10 KeV to about 50 KeV.

The high concentration of dopant 94 within regions 96 and 98 preferably overwhelms the previously implanted dopants 80 and 90, forming the relatively high conductivity source region 60 and drain region 62 overlapping an area previously occupied by the implant regions 82, 84 and 92. To insure that the previously implanted dopants 80 and 90 are overwhelmed within the source and drain implant regions 96 and 98, an additional first polarity conductivity enhancing dopant implant (not shown) may be conducted, the additional dopant implant being self-aligned with regions 96 and 98 by spacers 68 and 70.

Source region 60 and drain region 62 are displaced from lateral edges 64 and 66 of gate 48 by about a thickness of sidewall spacers 68 and 70. Preferably this thickness will be from about 200 angstroms to about 1000 angstroms. The portion of LDD implant regions 82 and 84 beneath the sidewall spacers becomes source and drain LDD regions 56 and 58, respectively. A portion of the internal junction region implant 92 beneath sidewall spacer 70 ultimately forms the internal junction region 50. Thus, the result of the processing steps of FIGS. 5–8 is to produce a transistor device 100, having a single internal junction region 50. The junction region 50 being formed within the drain LDD region 58.

Although the processing steps of FIGS. 5–8 have been illustrated as forming a single internal junction region 50, the process can readily be modified to form two or more internal junction regions. For instance, two internal junctions, one within the source LDD region 56 and the other within the drain LDD region 58, can be formed by eliminating the mask 88 from the processing step of FIG. 6. Also, the process of FIGS. 5–8 can be modified to form a single internal junction region 50 within the source LDD region 56, while forming no internal junction region in the drain active region 54, by placing the mask 88 over the drain active region 54 instead of over the source active region 52.

It is noted that subsequent heating of the transistor device 100 can diffuse the shown internal junction region 50 so that the internal junction region extends only partially into the LDD region and the remainder is within drain region 62. Also, such subsequent heating can diffuse the LDD region 58 under gate 48, and diffuse internal junction region 50 to be under gate edge 66. Internal junction region 50 can thereby be placed below the gate edge 66 while still being contained entirely within a first polarity region. Also, as described with the reference to FIGS. 9–11, the internal junction region 50 can be implanted directly beneath the lateral gate edge 66 by utilizing angled implants of the first and second polarity dopants, 80 and 90, respectively.

It is additionally noted that, although the internal junction region 50 is shown in the method of FIGS. 5–8 as being formed by an implant, and although the sidewall spacers 68 and 70 are preferably insulative material which is not doped, the internal junction region 50 could also be formed by out-diffusion of a second polarity dopant from a doped sidewall spacer. For instance, in an NMOS device, the sidewall spacers can comprise boron-doped oxide (or boron-doped nitride), and boron can be out-diffused from the spacers to form an internal junction region beneath the spacers.

Figure 9:
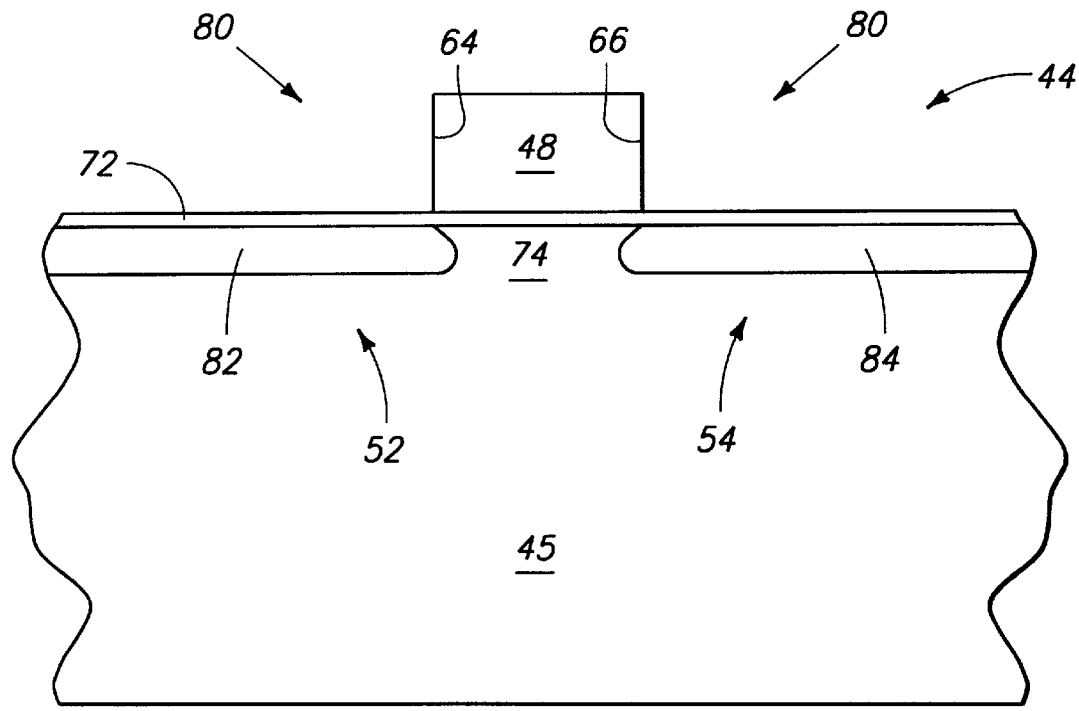
FIG. 9 shows a semiconductor wafer fragment processed according to a second embodiment of the present invention.

Referring to FIG. 9, a semiconductor wafer fragment 44 is shown at a processing step analogous to the processing step shown in FIG. 5. The difference between the FIG. 9 processing step and that of FIG. 5 is that the first polarity dopant 80 is implanted at an angle in FIG. 9 to thereby extend LDD implant regions 82 and 84 beneath the lateral edges 64 and 66 of gate 48. Source and drain active regions 52 and 54 are thereby extended further beneath gate 48 in the processing step of FIG. 9 than in the processing step of FIG. 5.

Figure 10:
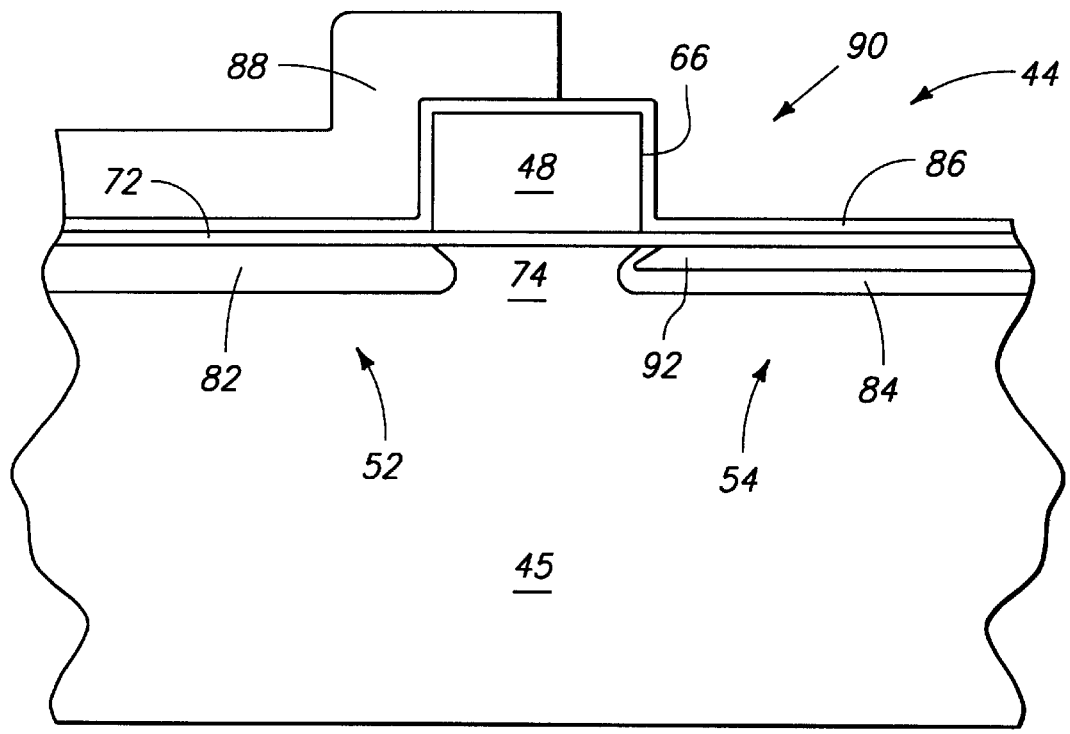
FIG. 10 shows the FIG. 9 wafer fragment at a processing step subsequent to FIG. 9.

Referring next to FIG. 10, a processing step analogous to that of FIG. 6 is illustrated. The FIG. 10 processing step differs from that of FIG. 6 in that the FIG. 10 processing step utilizes an angled implant to implant the second polarity dopant 90. Accordingly, the internal junction region implant 92 in FIG. 10 extends further inward (toward gate 48) than does the similar implant in FIG. 6. Preferably, the angled implant of dopant 90 extends the internal junction region implant 92 beneath a lateral gate edge 66.

Figure 11:
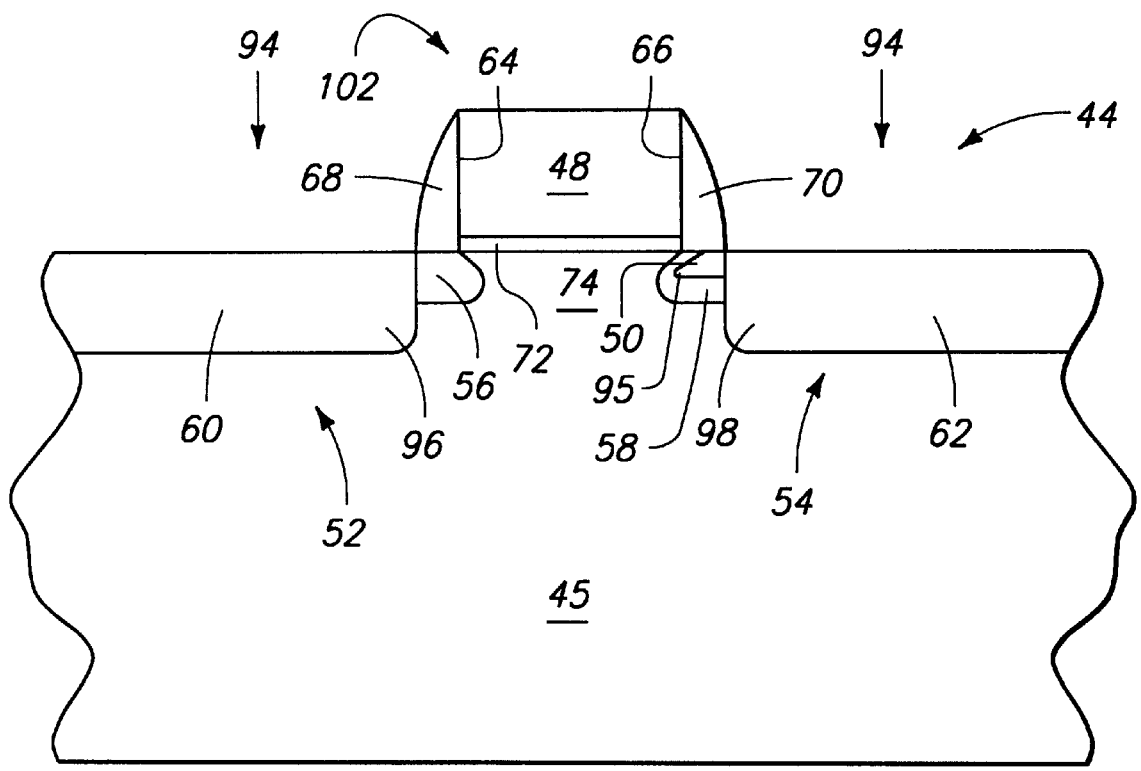
FIG. 11 shows the FIG. 9 wafer fragment at a processing step subsequent to FIG. 10.

Referring next to FIG. 11, the semiconductor wafer fragment 44 is shown at a processing step subsequent to FIG. 10, and analogous to that of FIG. 8. As in FIG. 8, the first polarity dopant 94 is implanted to form a high conductivity source region 60 and a high conductivity drain region 62. Also, as in FIG. 8, the implant of 94 is preferably sufficiently heavy to overwhelm the implant of regions 92, 82 and 84. The result of steps 9–11 is to produce a transistor device 102. The transistor device 102 differs from the device 100 (shown in FIG. 8) in that the LDD regions 56 and 58, and the internal junction region 50, extend further inward (toward gate 48) in the device 102 than in the device 100. Preferably, the internal junction region 50 comprises a portion 95 extending beneath a gate edge 66 of transistor gate 48. The FIG. 9–11 method accomplishes this preferable extension beneath a gate edge somewhat better than the FIG. 5–8 method, in that the angled implants of dopants 80 and 92 may ultimately form structures 50 and 58 which extend further inward (i.e., toward a channel region 74) than do the non-angled implants of FIGS. 5–8.

The embodiments illustrated above are preferred embodiments of the present invention. The invention also encompasses other embodiments which have not been shown, and is to be limited only by the scope of the appended claims. For instance, although the internal junction regions 50 are generally shown having an upper surface 74 coextensive with an upper surface 76 (see FIG. 2) of wafer 45, the internal junction regions can also be formed deeper within the first polarity regions of either the source or drain active regions 52 and 54 so that the upper surface of the internal junction regions are not coextensive with the upper surface of the semiconductor wafer. However, in such embodiments it is thought that the internal junction regions will be less effective in alleviating DIBL.

Also, although the internal junction regions 50 are shown received within the LDD regions 56 and 58, it is to be understood that the internal junction regions could also be formed within the source region 60 or the drain region 62 without extending into an LDD region.

Also, although the internal junction region 50 is shown as generally bulb-shaped, the internal junction regions could comprise a number of alternate shapes.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a transistor device on a semiconductor substrate, comprising:

forming a transistor gate on the semiconductor substrate;

defining a source active region and a drain active region proximate the transistor gate;

forming first conductivity-type source and drain LDD regions within the source and drain active regions, respectively;

forming first conductivity-type source and drain regions within the source and drain active regions, respectively; and forming a second conductivity-type region selectively within the drain active region and not within the source active region, the second conductivity-type region being entirely received within one or both of the drain LDD region and the drain region.

2. The method of claim 1 wherein the first conductivity-type is n-type and the second conductivity-type is p-type.

3. The method of claim 1 wherein the first conductivity-type is p-type and the second conductivity-type is n-type.

4. The method of claim 1 wherein the second conductivity-type region is entirely received within the drain LDD region.

5. The method of claim 1 wherein the forming the second conductivity-type region comprises angled implanting of second conductivity-type dopant to beneath the transistor gate.

6. A method of forming a transistor device on a semiconductor substrate, comprising:

forming a transistor gate on the semiconductor substrate, the transistor gate comprising a lateral edge;

defining a source active region and a drain active region proximate the transistor gate;

implanting a first conductivity-type dopant into the source and drain active regions to form first conductivity-type implant regions within the source and drain active regions;

after forming the first conductivity-type implant regions, forming a spacer along the transistor gate lateral edge and over a portion of the drain active region;

forming a patterned masking layer to cover the source active region while not covering at least some of the drain active region; and while the spacer is along the transistor gate lateral edge and while the patterned masking layer is over the source active region, implanting a second conductivity-type dopant into the drain active region to form an internal junction implant region, the internal junction implant region being entirely received within the first conductivity type implant region in the drain active region; and wherein one of the first and second conductivity types is p-type and the other is n-type.

7. The method of claim 6 wherein the first conductivity-type is n-type and the second conductivity-type is p-type.

8. The method of claim 6 wherein the first conductivity-type is p-type and the second conductivity-type is n-type.

9. The method of claim 6 wherein the implanting the second conductivity-type dopant comprises angled implanting of the second conductivity-type dopant to beneath the transistor gate.

10. A method of forming a transistor device on a semiconductor substrate, comprising:

forming a transistor gate on the semiconductor substrate, the transistor gate comprising lateral edges;

defining a source active region and a drain active region operatively adjacent the transistor gate;

implanting a first conductivity-type dopant into the source and drain active regions to form first conductivity-type LDD implant regions within the source and drain active regions;

after forming the LDD implant regions, forming an insulative layer over the transistor gate lateral edges;

forming a patterned masking layer to cover the source active region while leaving the drain active region exposed;

while the insulative layer is over the transistor gate lateral edges and while the patterned masking layer is over the source active region, implanting a second conductivity-type dopant into the drain active region to form an internal junction implant region, the internal junction implant region being entirely received within the first conductivity type LDD implant region in the drain active region;

removing the patterned masking layer from over the source active region;

after removing the patterned masking layer, forming sidewall spacers along the transistor gate lateral edges;

while the sidewall spacers are along the transistor gate lateral edges, forming first conductivity type source and drain regions within the source and drain active regions; and wherein one of the first and second conductivity types is p-type and the other is n-type.

11. The method of claim 10 wherein the first conductivity-type is n-type and the second conductivity-type is p-type.

12. The method of claim 10 wherein the first conductivity-type is p-type and the second conductivity-type is n-type.

* * * * *